United States Patent
Sharma et al.

(10) Patent No.: US 12,119,176 B2
(45) Date of Patent: Oct. 15, 2024

(54) SUPERCAPACITORS AND INTEGRATED ASSEMBLIES CONTAINING SUPERCAPACITORS

(71) Applicant: Micron Technology, Inc., Boise, ID (US)

(72) Inventors: Pankaj Sharma, Boise, ID (US); Sidhartha Gupta, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 220 days.

(21) Appl. No.: 17/179,890

(22) Filed: Feb. 19, 2021

(65) Prior Publication Data
US 2022/0270830 A1   Aug. 25, 2022

(51) Int. Cl.
*H01G 11/26*   (2013.01)
*H01G 11/08*   (2013.01)
(Continued)

(52) U.S. Cl.
CPC .............. *H01G 11/26* (2013.01); *H01G 11/08* (2013.01); *H01G 11/36* (2013.01); *H01G 11/86* (2013.01);
(Continued)

(58) Field of Classification Search
CPC ........ G11C 5/141; H01G 11/08; H01G 11/26; H01G 11/28; H01G 11/36; H01G 11/52;
(Continued)

(56) References Cited

U.S. PATENT DOCUMENTS 9,455,094 B2   9/2016   Tour et al.
9,779,884 B2   10/2017  El-Kady et al.
(Continued)

FOREIGN PATENT DOCUMENTS

CN        109086425       12/2018
CN        202111269689.4   4/2024
WO        WO 2014/097015   6/2014

OTHER PUBLICATIONS

Huang, "On-chip micro-supercapacitors based on nano-structured carbon materials" HAL open science (Year: 2013).*
(Continued)

*Primary Examiner* — Syed I Gheyas
(74) *Attorney, Agent, or Firm* — Wells St. John P.S.

(57) ABSTRACT

Some embodiments include an integrated assembly having a supercapacitor supported by a semiconductor substrate. The supercapacitor includes first and second electrode bases. The first electrode base includes first laterally-projecting regions, and the second electrode base includes second laterally-projecting regions which are interdigitated with the first laterally-projecting regions. A distance between the first and second laterally-projecting regions is less than or equal to about 500 nm. Carbon nanotubes extend upwardly from the first and second electrode bases. The carbon nanotubes are configured as a first membrane structure associated with the first electrode base and as a second membrane structure associated with the second electrode base. Pseudocapacitive material is dispersed throughout the first and second membrane structures. Electrolyte material is within and between the first and second membrane structures. Some embodiments include methods of forming integrated assemblies.

23 Claims, 10 Drawing Sheets

(51) Int. Cl.

| | |
|---|---|
| *H01G 11/36* | (2013.01) |
| *H01G 11/86* | (2013.01) |
| *H01L 25/00* | (2006.01) |
| *H01L 25/16* | (2023.01) |
| *H01L 49/02* | (2006.01) |
| *H10B 99/00* | (2023.01) |
| *H01G 11/52* | (2013.01) |
| *H01G 11/58* | (2013.01) |

(52) U.S. Cl.
CPC .............. *H01L 25/16* (2013.01); *H01L 25/50* (2013.01); *H01L 28/75* (2013.01); *H01L 28/86* (2013.01); *H01L 28/88* (2013.01); *H10B 99/00* (2023.02); *H01G 11/52* (2013.01); *H01G 11/58* (2013.01)

(58) Field of Classification Search
CPC ........ H01G 11/58; H01G 11/86; H01L 25/16; H01L 25/50; H01L 27/1052; H01L 28/75; H01L 28/86; H01L 28/88; H01L 28/90; Y02E 60/13
See application file for complete search history.

(56) References Cited

U.S. PATENT DOCUMENTS

| | | | | |
|---|---|---|---|---|
| 9,824,828 | B2* | 11/2017 | Yang | H01G 11/84 |
| 9,892,869 | B2 | 2/2018 | Beidaghi et al. | |
| 2001/0023953 | A1 | 9/2001 | Schuegraf et al. | |
| 2003/0155467 | A1* | 8/2003 | Petrenko | B64D 15/22 244/134 R |
| 2008/0170982 | A1* | 7/2008 | Zhang | H01L 51/444 423/447.3 |
| 2010/0021819 | A1* | 1/2010 | Zhamu | H01G 11/42 429/231.8 |
| 2011/0041037 | A1* | 2/2011 | Frost | G06F 11/1068 714/763 |
| 2011/0200873 | A1* | 8/2011 | Hu | B32B 15/16 429/188 |
| 2012/0134071 | A1* | 5/2012 | Sadoway | B82Y 30/00 977/932 |
| 2012/0236467 | A1* | 9/2012 | Kang | H01G 11/68 257/532 |
| 2012/0302031 | A1* | 11/2012 | Wu | H01L 21/31111 438/711 |
| 2013/0063861 | A1* | 3/2013 | Wu | H01L 28/86 29/25.41 |
| 2013/0200489 | A1* | 8/2013 | Huang | H01L 23/5223 257/532 |
| 2013/0250479 | A1* | 9/2013 | Manohara | H01G 4/242 361/321.5 |
| 2013/0250484 | A1* | 9/2013 | Kinlen | H01M 4/602 29/25.03 |
| 2015/0004373 | A1* | 1/2015 | Shih | C23C 16/40 430/311 |
| 2015/0287544 | A1* | 10/2015 | Irazoqui | H01G 11/84 307/104 |
| 2016/0148759 | A1* | 5/2016 | El-Kady | C01B 32/194 427/79 |
| 2016/0172123 | A1* | 6/2016 | Yang | H01G 11/36 29/25.03 |
| 2016/0268061 | A1* | 9/2016 | Wang | C01G 45/02 |
| 2016/0293347 | A1* | 10/2016 | Guo | H01G 11/24 |
| 2017/0033371 | A1* | 2/2017 | Cordova | H01M 4/13 |
| 2017/0062821 | A1* | 3/2017 | Tour | H01M 4/663 |
| 2017/0278643 | A1* | 9/2017 | El-Kady | H01G 11/66 |
| 2017/0309411 | A1* | 10/2017 | Qian | H01G 11/86 |
| 2018/0004594 | A1* | 1/2018 | Davis | G06F 11/1012 |
| 2018/0082796 | A1* | 3/2018 | Mahrholz | H01G 11/26 |
| 2018/0183041 | A1* | 6/2018 | Tour | C01B 32/168 |
| 2018/0212253 | A1* | 7/2018 | Lockett | H01G 11/26 |
| 2018/0290431 | A1 | 10/2018 | Tagami et al. | |
| 2018/0323016 | A1* | 11/2018 | El-Kady | H01G 11/24 |
| 2019/0221891 | A1* | 7/2019 | Lockett | H01M 6/40 |
| 2020/0388444 | A1* | 12/2020 | Luo | H01G 11/54 |
| 2021/0207941 | A1* | 7/2021 | Park | G01N 27/22 |

OTHER PUBLICATIONS

DE102013104396 (Year: 2014).*
Ahmad et al., "High Quality Carbon Nanotubes on Conductive Substrates Grown at Low Temperatures", Advanced Functional Materials, vol. 25, Issue 28, Jul. 22, 2015 (Year: 2015).*
Amade et al., "Optimization of MnO2/Vertically Aligned Carbon Nanotube Composite for Supercapacitor Application", Journal of Power Sources vol. 196, No. 13, 2011, Netherlands, pp. 5779-5783.
An et al., "Electrochemical Properties of High-Power Supercapacitors using Single-Walled Carbon Nanotube Electrodes", Advanced Functional Materials vol. 11, Issue 5, 2001, United Kingdom, pp. 387-392.
Arun et al., "Tunable MEMS Capacitors using Vertical Carbon Nanotube Arrays Grown on Metal Lines", Nanotechnology vol. 22, No. 2, 2011, United Kingdom, 9 pages.
Baughman et al., "Carbon Nanotubes—The Route Toward Applications," Science vol. 297, 2002, United States, pp. 787-792.
Beidaghi et al., "Micro-Supercapacitors Based on Interdigital Electrodes of Reduced Graphene Oxide and Carbon Nanotube Composites with Ultrahigh Power Handling Performance", Advanced Functional Materials vol. 22, Issue 21, 2012, United Kingdom, pp. 4501-4510.
Chen et al., "Carbon Nanomaterials for High-Performance Supercapacitors", Materials Today vol. 16, Nos. 7/8, 2013, Netherlands, pp. 272-280.
Chen et al., "Pseudocapacitive Properties of Carbon Nanotube/Manganese Oxide Electrode Deposited by Electrophoretic Deposition", Diamond & Related Materials 18, 2009, Netherlands, pp. 482-485.
Chou et al., "Electrodeposition of MnO2 Nanowires on Carbon Nanotube Paper as Free-Standing, Flexible Electrode for Supercapacitors", Electrochemistry Communications vol. 10, Issue 11, 2008, Netherlands, pp. 1724-1727.
Dai et al., "Carbon Nanomaterials for Advanced Energy Conversion and Storage", Small, 2012, Germany, 37 pages.
El-Kady et al., "Scalable Fabrication of High-Power Graphene Micro-Supercapacitors for Flexible and On-Chip Energy Storage", Nature Communications, Feb. 2013, United Kingdom, 9 pages.
Fan et al., "Electrochemically Induced Deposition Method to Prepare ?-MnO2/Multi-Walled Carbon Nanotube Composites as Electrode Material in Supercapacitors", Materials Research Bulletin vol. 43, Issues 8-9, 2008, United Kingdom, pp. 2085-2091.
Fan et al., "High Dispersion of ?-MnO2 on Well-Aligned Carbon Nanotube Arrays and its Application in Supercapacitors", Diamond & Related Materials vol. 17, Issue 11, 2008, Netherlands, pp. 1943-1948.
Fan et al., "Preparation and Characterization of Manganese Oxide/CNT Composites as Supercapacitive Materials", Diamond & Related Materials vol. 15, Issue 9, 2006, Netherlands, pp. 1478-1483.
Frackowiak et al., "Nanotubular Materials for Supercapacitors", Journal of Power Sources vols. 97-98, 2001, Netherlands, pp. 822-825.
Futaba et al., "Shape-Engineerable and Highly Densely Packed Single-Walled Carbon Nanotubes and their Application as Super-Capacitor Electrodes", Nature Materials vol. 5, 2006, United Kingdom, pp. 987-994.
Gao et al., "Direct Laser Writing of Micro-Supercapacitors on Hydrated Graphite Oxide Films", Nature Nanotechnology vol. 6, 2011, United Kingdom, pp. 496-500.
Hou et al., "Design and Synthesis of Hierarchical MnO2 Nanospheres/Carbon Nanotubes/Conducting Polymer Ternary Composite for High Performance Electrochemical Electrodes", Nano Letters vol. 10, 2010, United States, pp. 2727-2733.
Izadi-Najafabadi et al., "High-Power Supercapacitor Electrodes from Single-Walled Carbon Nanohorn/Nanotube Composite", ACS Nano Vol. 5, No. 2, 2011, United States, pp. 811-819.

(56) References Cited

OTHER PUBLICATIONS

Kaempgen et al., "Printable Thin Film Supercapacitors using Single-Walled Carbon Nanotubes", Nano Letters vol. 9, 2009, United States, pp. 1872-1876.
Ko et al., "Electrochemical Properties of MnO2/Activated Carbon Nanotube Composite as an Electrode Material for Supercapacitor", Materials Chemistry and Physics vol. 114, Issues 2-3, 2009, Netherlands, pp. 837-841.
Le Poche et al., "Radio-Frequency Plasma System to Selectively Grow Vertical Field-Aligned Carbon Nanofibers from a Solid Carbon Source", Carbon vol. 45, Issue 15, 2007, United Kingdom, pp. 2904-2916.
Lin et al., "3-Dimensional Graphene Carbon Nanotube Carpet-Based Microsupercapacitors with High Electrochemical Performance", Nano Letters vol. 13, 2013, United States, pp. 72-78.
Liu et al., "Graphene-Based Non-Boolean Logic Circuits", Journal of Applied Physics vol. 114, 2013, United States, 10 pages.
Liu et al., "Hybrid Supercapacitor Based on Coaxially Coated Manganese Oxide on Vertically Aligned Carbon Nanofiber Arrays", Chemistry of Materials 22, 2010, United States, pp. 5022-5030.
Liu et al., "Novel and High-Performance Asymmetric Micro-Supercapacitors Based on Graphene Quantum Dots and Polyaniline Nanofibers", Nanoscale 5, 2013, United Kingdom, pp. 6053-6062.
Lu et al., "High Performance Electrochemical Capacitors from Aligned Carbon Nanotube Electrodes and Ionic Liquid Electrolytes", Journal of Power Sources 189, 2009, Netherlands, pp. 1270-1277.
Ma et al., "Electrochemical Properties of Manganese Oxide Coated onto Carbon Nanotubes for Energy-Storage Applications", Journal of Power Sources 178, 2008, Netherlands, pp. 483-489.
Nam et al., "Electrodeposited Manganese Oxides on Three-Dimensional Carbon Nanotube Substrate: Supercapacitive Behaviour in Aqueous and Organic Electrolytes", Journal of Power Sources 188, 2009, Netherlands, pp. 323-331.
Niu et al., "All-Solid-State Flexible Ultrathin Micro-Supercapacitors Based on Graphene", Advanced Materials vol. 25, Issue 29, 2013, United States, pp. 4035-4042.
Niu et al., "High Power Electrochemical Capacitors Based on Carbon Nanotube Electrodes", Applied Physics Letters col. 70, 1997, United States, pp. 1480-1482.
Peng et al., "Ultrathin Two-Dimensional MnO2/Graphene Hybrid Nanostructures for High-Performance, Flexible Planar Supercapacitors", Nano Letters vol. 13, 2013, United States, pp. 2151-2157.
Subramanian et al., "Synthesis and Electrochemical Characterizations of Amorphous Manganese Oxide and Single Walled Carbon Nanotube Composites as Supercapacitor Electrode Materials", Electrochemistry Communications vol. 8, Issue 5, 2006, Netherlands, pp. 827-832.
Wang et al., "Manganese Dioxide-Carbon Nanotube Nanocomposites for Electrodes of Electrochemical Supercapacitors", Scripta Materialia 61, 2009, United Kingdom, pp. 1079-1082.
Wang et al., "Manganese Oxide/MWNTs Composite Electrodes for Supercapacitors", Solid State Ionics 176, 2005, Netherlands, pp. 1169-1174.
Wu et al., "Graphene-Based In-Plane Micro-Supercapacitors with High Power and Energy Densities", Nature Communications, 2013, United Kingdom, 8 pages.
Xie et al., "Characterization of a Manganese Dioxide/Carbon Nanotube Composite Fabricated Using an in situ Coating Method", Carbon vol. 45, Issue 12, 2007, United Kingdom, pp. 2365-2373.
Xue et al., "Structure-Based Enhanced Capacitance: In situ Growth of Highly Ordered Polyaniline Nanorods on Reduced Graphene Oxide Patterns", Advanced Functional Materials vol. 22, Issue 6, 2012, United Kingdom, pp. 1284-1290.
Yan et al., "Carbon Nanotube/MnO2 Composites Synthesized by Microwave-Assisted Method for Supercapacitors with High Power and Energy Densities", Journal of Power Sources 194, 2009, Netherlands, pp. 1202-1207.
Zhang et al., "Fabrication of a Vertically Aligned Carbon Nanotube Electrode and its Modification by Nanostructured MnO2 for Supercapacitors", Pure and Applied Chemistry vol. 81, No. 12, 2009, United States, pp. 2317-2325.
Zhang et al., "Growth of Manganese Oxide Nanoflowers on Vertically-Aligned Carbon Nanotube Arrays for High-Rate Electrochemical Capacitive Energy Storage", Nano Letters vol. 8, No. 9, 2008, United States, pp. 2664-2668.

\* cited by examiner

SUPERCAPACITORS AND INTEGRATED ASSEMBLIES CONTAINING SUPERCAPACITORS

TECHNICAL FIELD

Supercapacitors. Integrated assemblies. Non-volatile dual in-line memory modules (NVDIMMs). Solid state drives (SSDs). Methods of forming supercapacitors, integrated assemblies, NVDIMMs and SSDs.

BACKGROUND

Supercapacitors (also known as ultracapacitors) are high-capacity capacitors that may utilize electrostatic double-layer capacitance and/or electrochemical pseudocapacitance instead of requiring the solid dielectric of ordinary capacitors.

Supercapacitors may be utilized in integrated assemblies. For instance, the supercapacitors may be utilized to provide backup power relative to modules having volatile memory (e.g., dynamic random-access memory (DRAM)) so that such volatile memory may be backed-up onto less volatile memory (or nonvolatile memory) in the event of power loss to the modules.

It is desired to develop improved supercapacitors, and to develop improved methods of forming supercapacitors. It would be desirable for the improved supercapacitors to be suitable for utilization in integrated assemblies.

DETAILED DESCRIPTION OF THE ILLUSTRATED EMBODIMENTS

Some embodiments include supercapacitor configurations suitable for incorporation into integrated assemblies, such as, for example, integrated assemblies comprising nonvolatile memory (e.g., nonvolatile random-access memory (NVRAM)). Some embodiments includes methods of forming supercapacitor configurations. Example embodiments are described with reference to FIGS. 1-10.

The supercapacitors described herein may be suitable as power-backup-sources in integrated assemblies. For instance, FIG. 1 schematically describes an example integrated assembly 100 comprising a supercapacitor as a power-backup.

The assembly 100 may be considered to be an example of an assembly which includes both volatile and nonvolatile memory, with the specific example being an assembly configured to include NVDIMM (nonvolatile dual in-line memory module). Embodiments described herein may be utilized with assemblies other than the assembly of FIG. 1, and such other assemblies may or may not include both volatile and nonvolatile memory.

Figure 9:
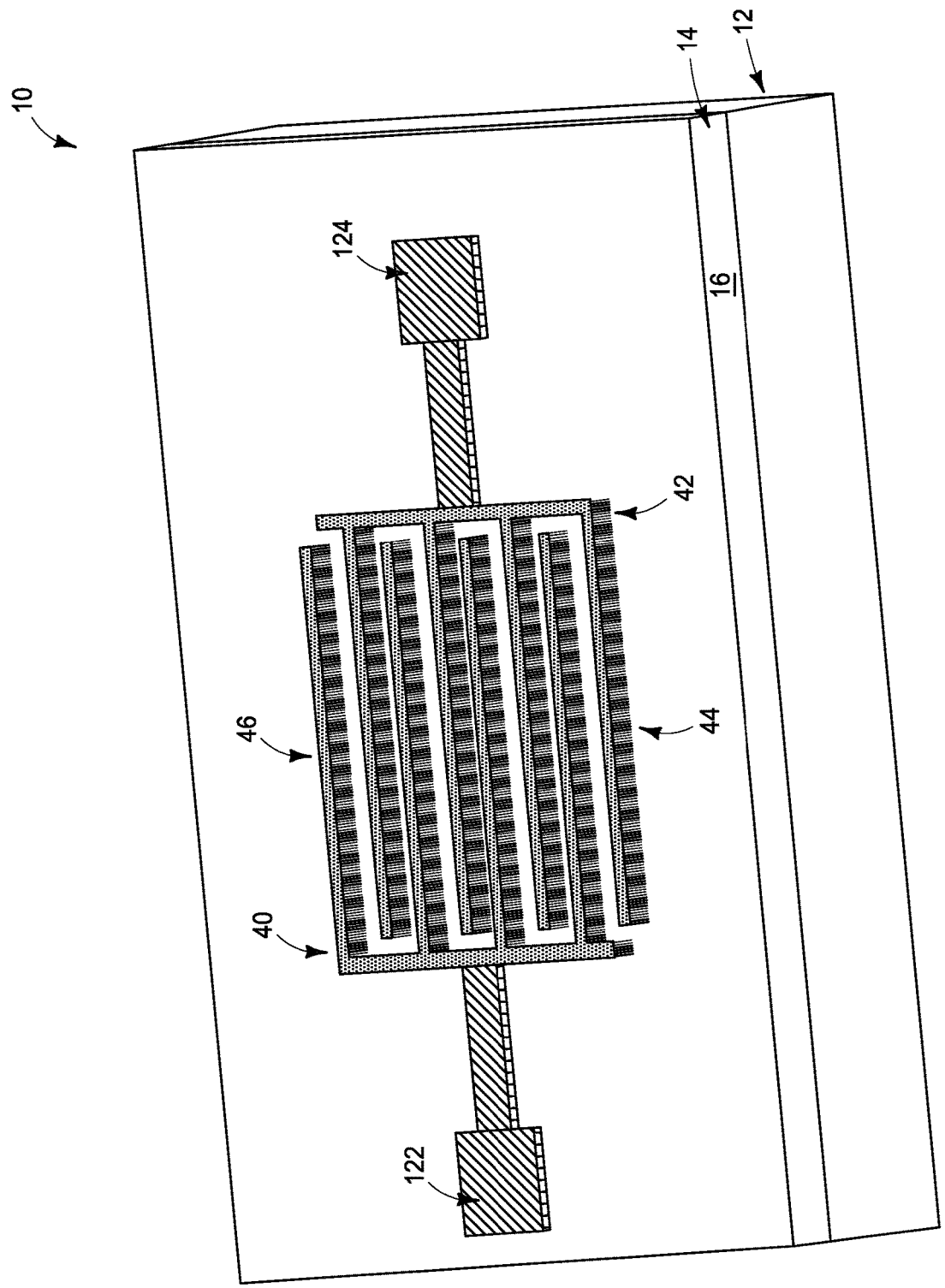
FIG. 9 is a diagrammatic three-dimensional view of a region of the example assembly of FIG. 8.
Figure 10:
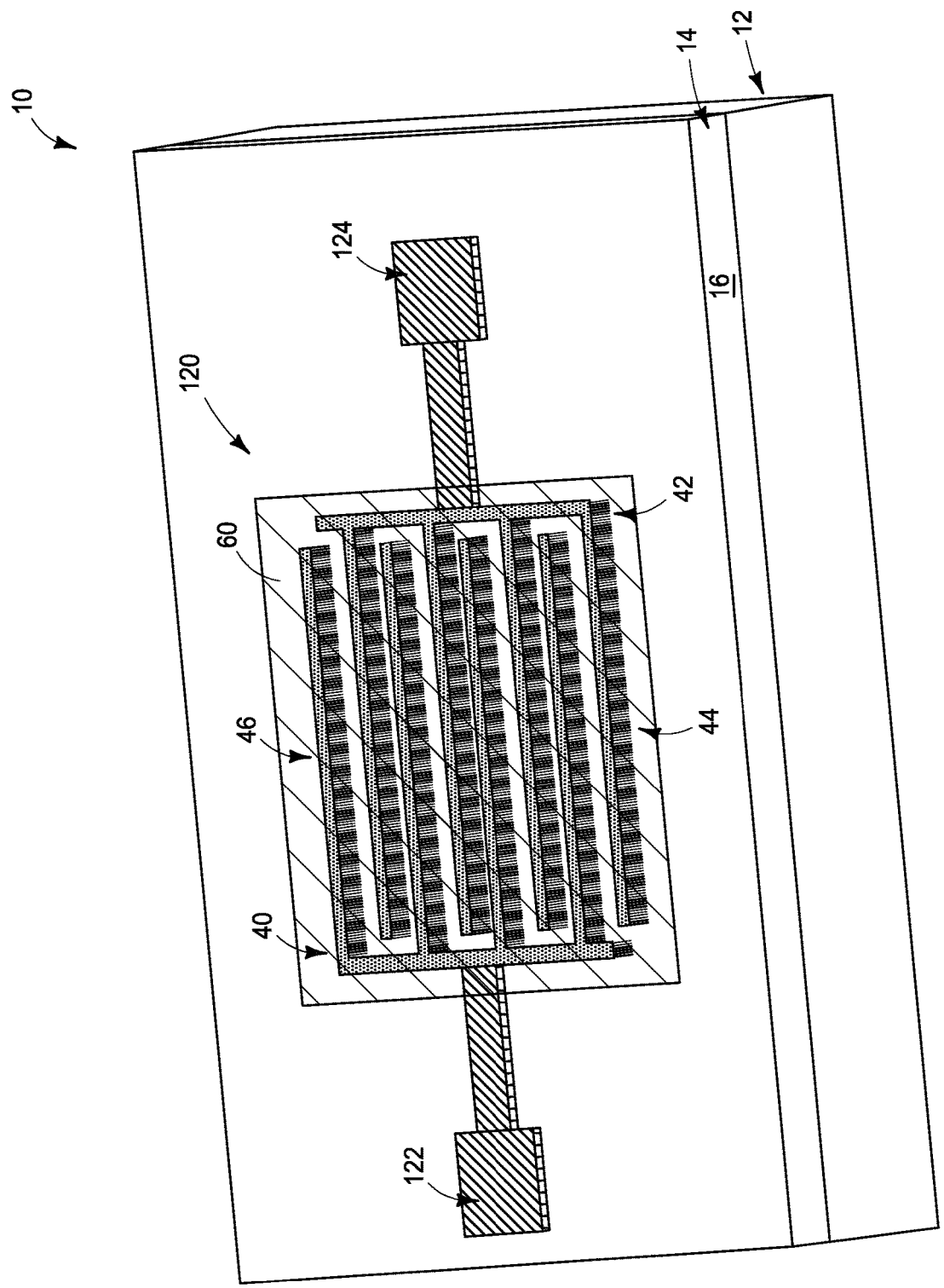
FIG. 10 is a diagrammatic three-dimensional view of the example region of the example assembly of FIG. 9 at an example process stage subsequent to that of FIG. 9.

The assembly 100 includes a supercapacitor 120 of the type that may be formed relative to the embodiments that follow. The supercapacitor 120 is coupled with a power regulator 130. The supercapacitor 120 is shown to have a positive terminal 122 and a negative terminal 124, with such terminals being electrically coupled with the power regulator 130. The positive and negative terminals 122 and 124 may be coupled to electrodes associated with the supercapacitor, as shown in FIGS. 9 and 10 (discussed below).

Figure 1:
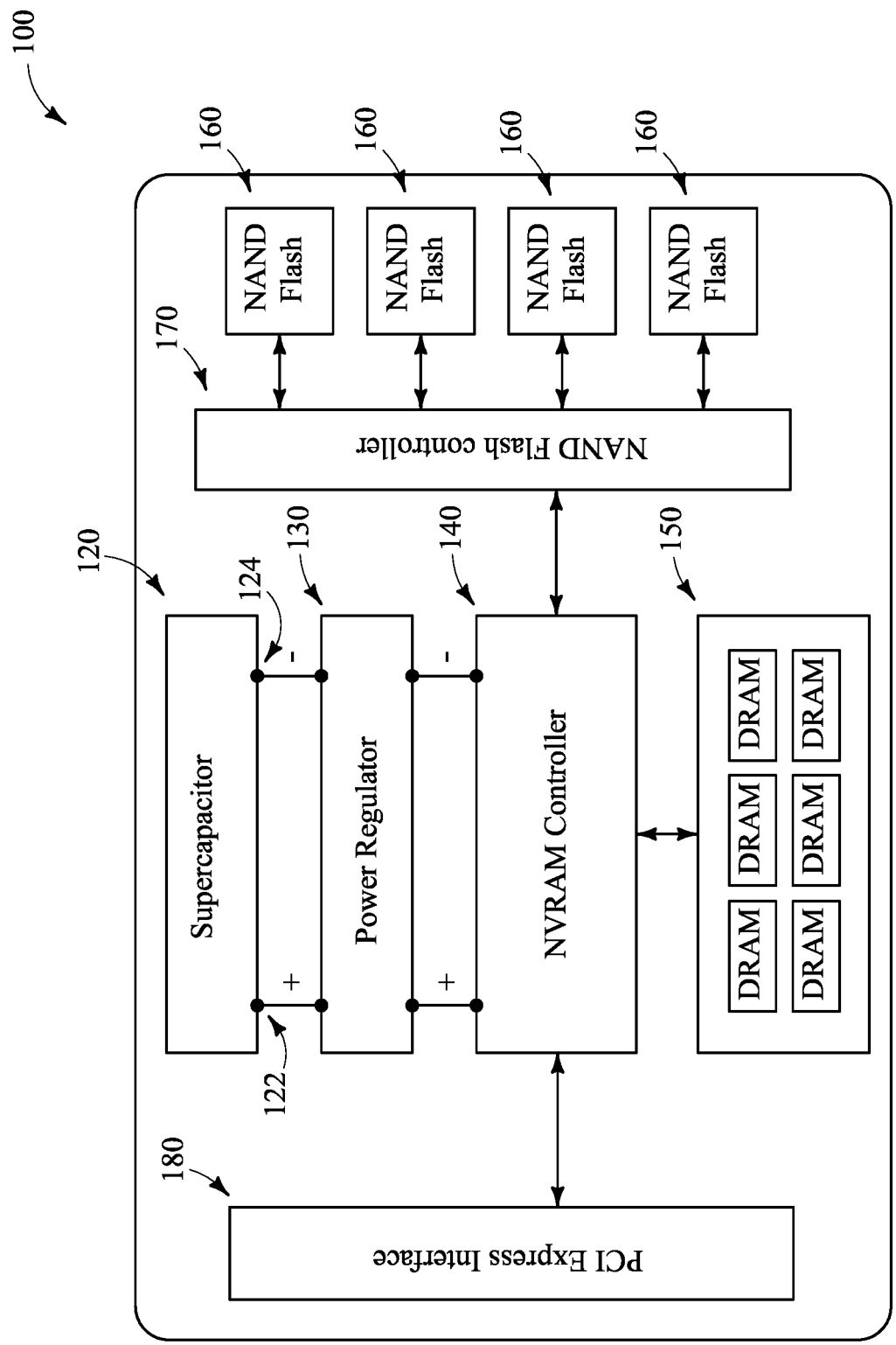
FIG. 1 is a schematic diagram of an example arrangement of example components of an example integrated assembly.

The power regulator 130 of FIG. 1 is coupled with a NVRAM controller 140. The controller 140 is coupled with volatile dynamic random-access memory (DRAM) 150, and is coupled to nonvolatile flash memory (NAND Flash) 160 through a NAND Flash Controller 170. In the illustrated embodiment, the NVRAM controller is also coupled with a PCI-Express Interface 180 (where PCI means a Peripheral Component Interconnect).

The supercapacitor 120 may be configured to provide backup power in the event of a loss of external power to the assembly 100. The backup power may enable data stored on the volatile DRAM to be moved to the nonvolatile Flash memory so that such data is not irretrievably lost as a result of the loss of the external power to the assembly 100.

Figure 2:
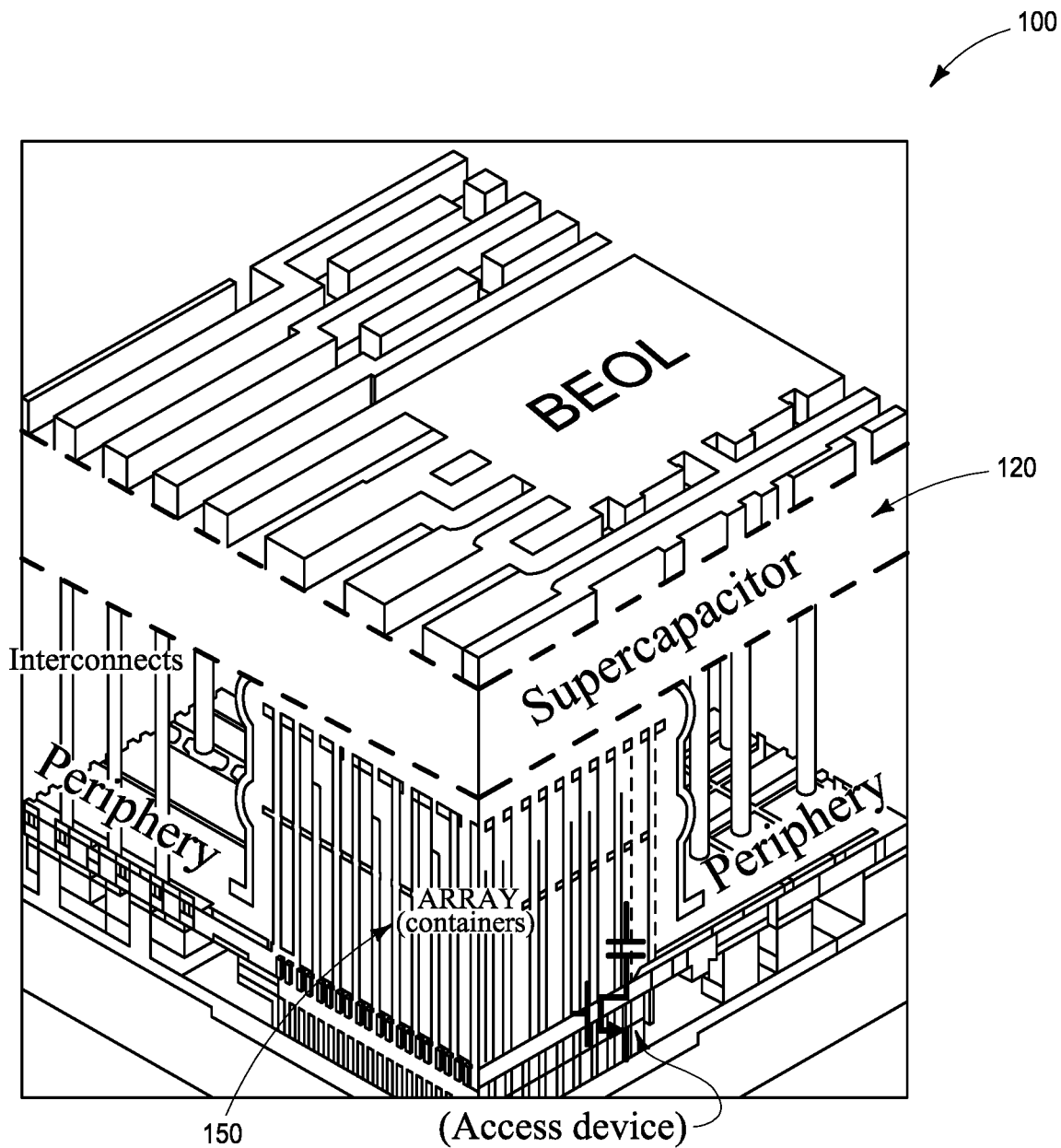
FIG. 2 is a diagrammatic three-dimensional view of an example arrangement of example components of an example integrated assembly.

FIG. 2 diagrammatically illustrates an example three-dimensional arrangement of various components of the assembly 100. All of the components shown in FIG. 1 may be within the same integrated-assembly-package as one another. In some embodiments, the assembly 100 of FIG. 2 may be considered to illustrate an arrangement in which all of the components of FIG. 1 are part of the same integrated chip package as one another (i.e., are within a monolithic assembly). The BEOL of FIG. 2 is back-end-of-line circuitry, as will be understood by persons of ordinary skill.

In the illustrated arrangement of FIG. 2, the supercapacitor 120 is provided directly over the DRAM array 150. The supercapacitor 120 is shown to have a larger footprint than the array 150, and accordingly the array 150 is only under a portion of the supercapacitor.

The diagrammatic illustration of FIG. 2 schematically shows one of the memory cells of the DRAM array 150, and specifically shows that such memory cell includes a capacitor in combination with a transistor (Access device). Such is an example memory cell of an example DRAM array. It is to be understood that in other embodiments the memory cells may have other configurations (for instance the capacitors within the memory cells may be replaced with other storage-elements, such as, example, resistive memory devices, phase change memory devices, etc.)

Figure 2A:
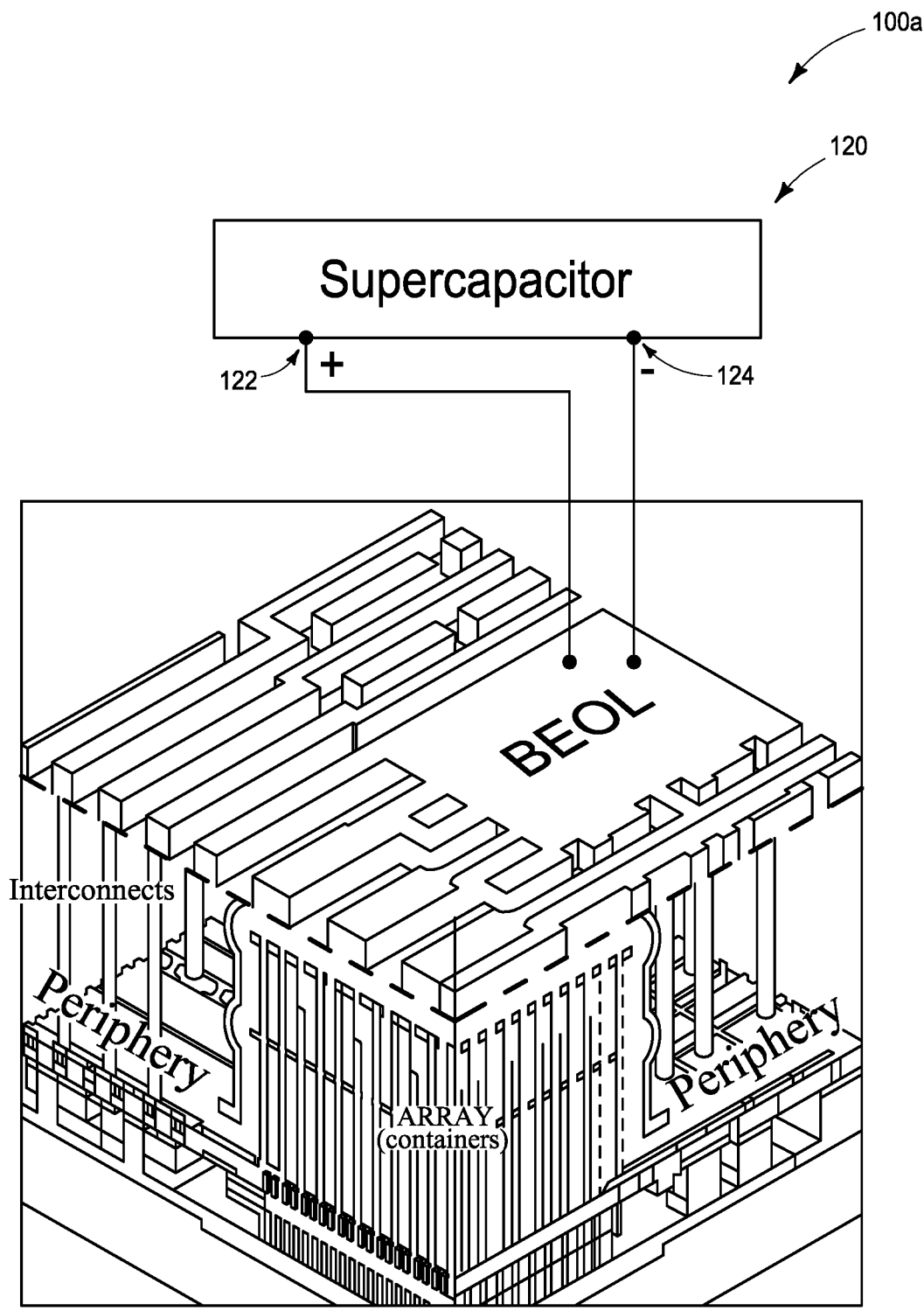
FIG. 2A is a diagrammatic three-dimensional view of an example arrangement of example components of an example integrated assembly.
Figure 2B:
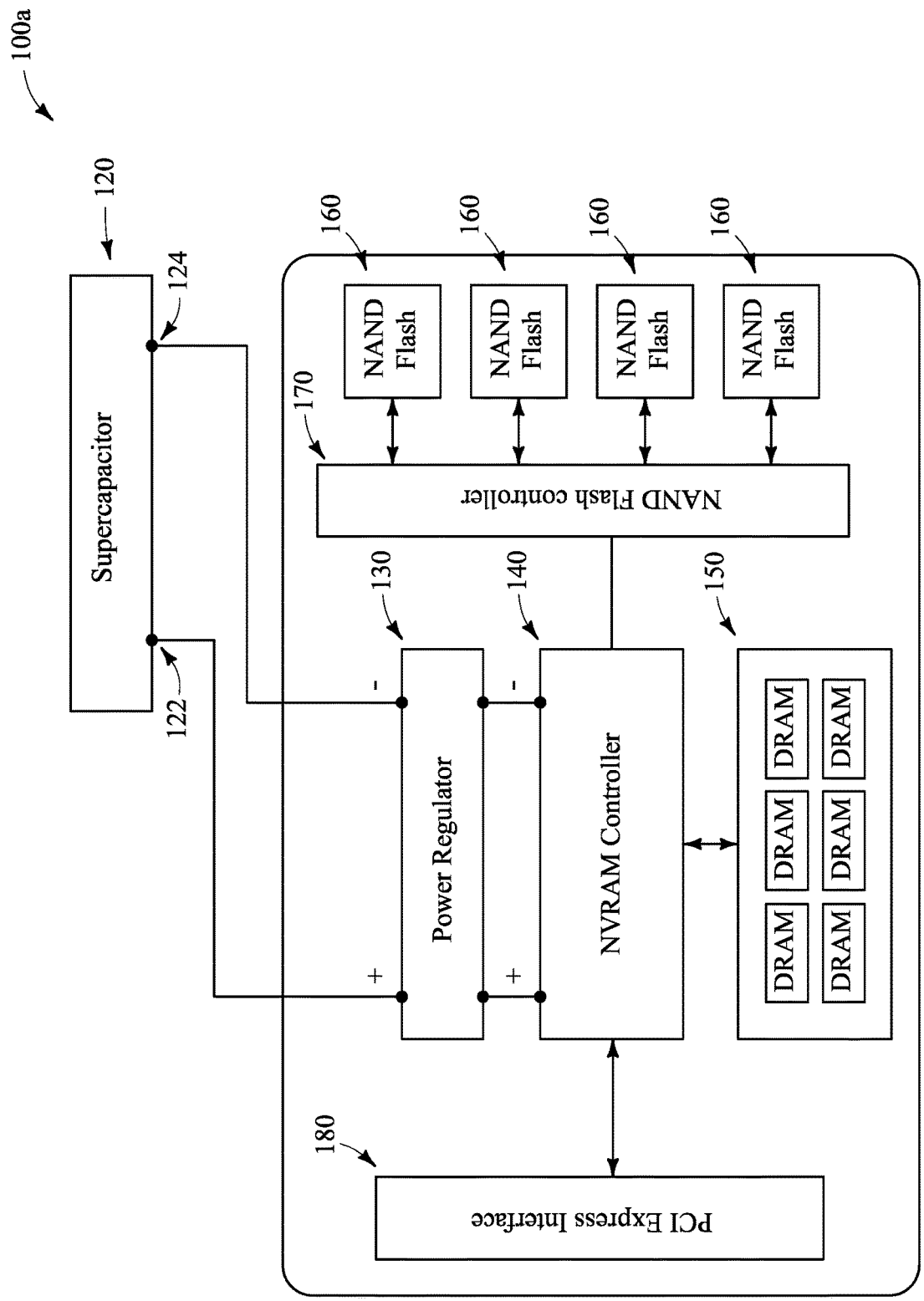
FIG. 2B is a schematic diagram of an example arrangement of example components of an example integrated assembly.

In some embodiments, the supercapacitor 120 may be formed off-chip relative to others of the components shown in FIG. 1. For instance, FIGS. 2A and 2B diagrammatically illustrate an example configuration of an assembly 100a in which the supercapacitor 120 is formed off-chip relative to other components (e.g., memory components). In other embodiments, the power regulator 130 (and possibly also the controller 140, etc.) may be formed with the supercapacitor 120 to be off-chip relative to one or more other components (e.g., memory components).

An example method for forming an example supercapacitor is described with reference to FIGS. 3-10.

Figure 3:
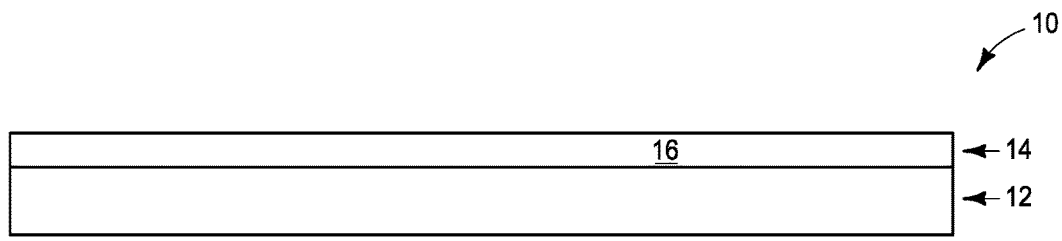
FIG. 3 is a diagrammatic cross-sectional side view of an example region of an example assembly at an example process stage of an example method.

Referring to FIG. 3, an integrated assembly 10 includes a base 12 and a layer 14 over the base 12.

The base 12 may comprise any suitable material. In some applications, the base 12 may comprise semiconductor material (e.g., may comprise, consist essentially of, or consist of monocrystalline silicon). The base 12 may be referred to as a semiconductor substrate if it comprises semiconductor material. The term "semiconductor substrate" means any construction comprising semiconductive material, including, but not limited to, bulk semiconductive materials, such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. In some embodiments, the base 12 may be a portion of a semiconductor wafer.

The layer 14 comprises insulative material 16. The insulative material 16 may comprise any suitable composition (s), and in some embodiments may comprise, consist essentially of, or consist of one or more of silicon dioxide, aluminum oxide, silicon nitride, etc.

In some embodiments, the base 12 may be omitted.

In some embodiments, the layer 14 may be over an assembly comprising memory cells (e.g., an assembly of the type shown in FIG. 2 as being under the supercapacitor 120). In such embodiments, the base 12 may correspond to the assembly comprising the memory cells, and the layer 14 may be considered to be formed monolithically over the assembly comprising the memory cells (i.e., on-chip with the memory cells). In other embodiments, the layer 14 may be formed off-chip relative to the assembly of the memory cells (e.g., in an assembly of the type shown in FIG. 2A), and the base 12 may correspond to a semiconductor chip (die) supporting the layer 14.

Figure 4:
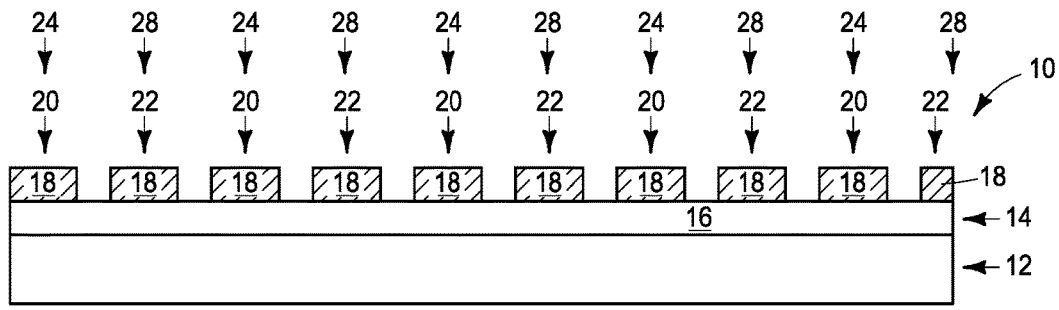
FIG. 4 is a diagrammatic cross-sectional side view of the example region of the example assembly of FIG. 3 at an example process stage subsequent to that of FIG. 3.

Referring to FIG. 4, conductive support material (e.g., metal-containing support material) 18 is deposited onto the insulative material 16 and is patterned into first and second components 20 and 22. In some embodiments, the components 20 and 22 may be referred to as base components (or as preliminary base configurations). Additional processing (describe below with reference to FIGS. 6-10) may be utilized to form the final configurations of the bases.

The support material 18 may comprise, for example, one or more metal nitrides. For instance, in some embodiments the support material 18 may comprise, consist essentially of, or consist of titanium nitride.

The support material 18 may be deposited utilizing any suitable methodology, including, for, one or more of atomic layer deposition, chemical vapor deposition, physical vapor deposition, etc.; and in some embodiments is deposited utilizing a sputter-deposition process.

Figure 5:
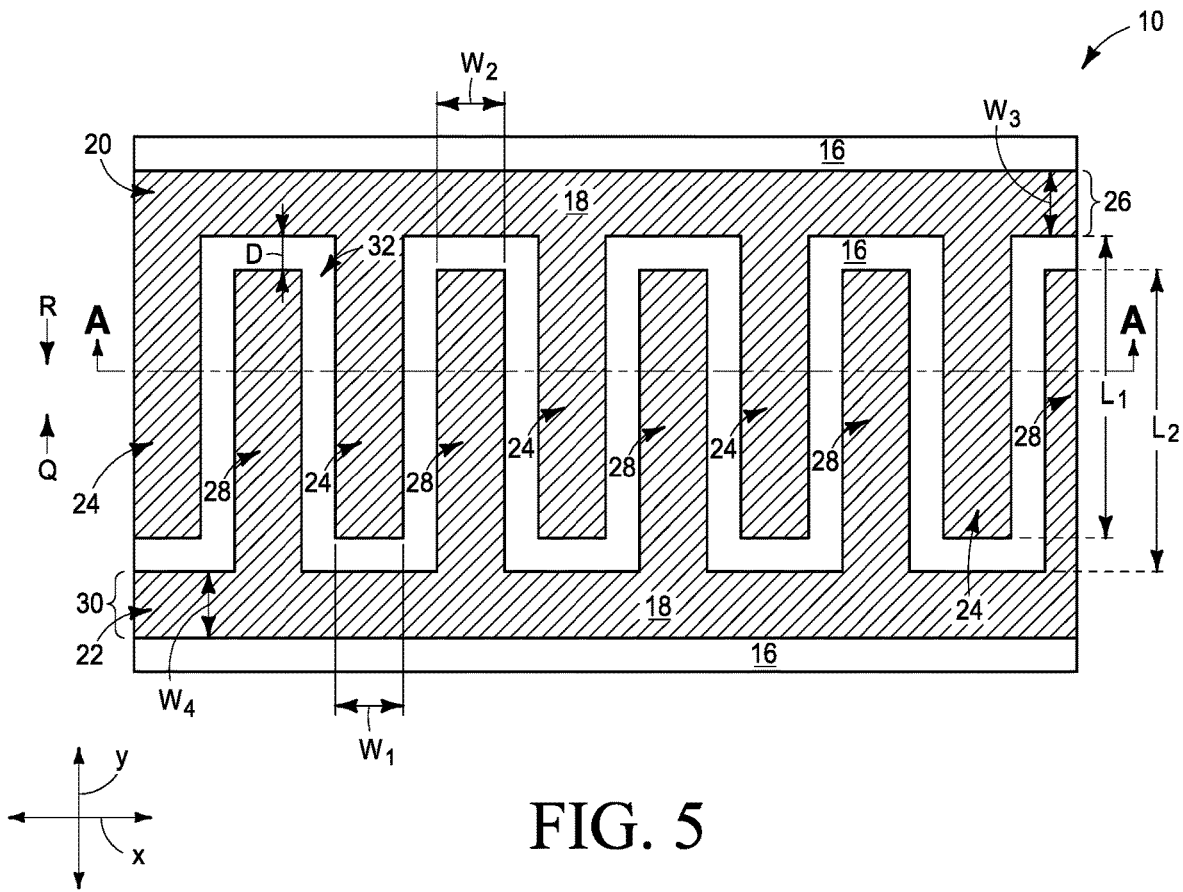
FIG. 5 is a diagrammatic top-down view of the example assembly of FIG. 4, with the view of FIG. 4 being along the line A-A of FIG. 5.

FIG. 5 shows a top view of the configuration of FIG. 4, with the configuration of FIG. 4 being along the line A-A of FIG. 5, and shows that the base components (or preliminary base configurations) 20 and 22 are interdigitated relative to one another. The material 18 may be formed into a desired configuration utilizing any suitable processing, and in some embodiments may be patterned utilizing one or both of electron beam lithography and inductively-coupled plasma etching.

FIG. 5 shows that the first electrode base component (or first preliminary electrode configuration) 20 includes first laterally-projecting regions (projections, fingers or finger regions) 24 which project outwardly from a mainstem (trunk, primary) region 26. The first laterally-projecting regions project along a first direction R from the mainstem region 26. The second electrode base component (or second preliminary electrode configuration) 22 includes second laterally-projecting regions (projections, fingers or finger regions) 28 which project outwardly from a mainstem (trunk, primary) region 30. The second laterally-projecting regions project along a second direction Q from the mainstem region 30, with the second direction Q being opposing to the first direction R.

The first and second laterally-projecting regions 24 and 28 are interdigitated with one another, and are spaced from one another by intervening regions 32. The intervening regions 32 comprise an intervening distance D between the electrode bases 20 and 22. Such intervening distance may be less than or equal to about 500 nanometers (nm), less than or equal to about 250 nm, less than or equal to about 150 nm, etc.; and in some embodiments may be within a range of from about 5 nm to about 500 nm, within a range of from about 50 nm to about 500 nm, etc. The small spacing between the interdigitated finger regions 24 and 28 may minimize a pathway for ion diffusion from electrolyte to electrode material in example embodiment supercapacitor configurations formed herein, which may enable high-energy and high-power density to be extracted from such supercapacitors. Additionally, the small spacing between the interdigitated finger regions may maximize (or at least substantially maximize) available electrochemical surface area in example supercapacitor embodiments described herein, which may enable high capacitance and fast charge/discharge rates to be achieved.

The first finger regions 24 have first widths $W_1$, and the second finger regions 28 have second widths $W_2$. The first and second widths $W_1$ and $W_2$ may be substantially the same as one another, and in some embodiments may be less than or equal to about 100 micrometers (μm). For instance the first and second widths $W_1$ and $W_2$ may be within a range of from about 3 μm to about 100 μm.

In some embodiments, the widths $W_1$ and $W_2$ may be considered to extend along an x-axis direction relative to the view of FIG. 5. Such x-axis direction may be orthogonal to (or at least substantially orthogonal to) the first and second directions R and Q of the projections 24 and 28. In some embodiments, one of the R and Q directions may be referred to as a first direction, the x-axis direction may be referred to as a second direction, and the other of the R and Q directions may be referred to as a third direction. The term "substantially orthogonal" means orthogonal to within reasonable tolerances of fabrication and measurement.

In some embodiments, the R and Q directions may be considered to extend along a y-axis direction relative to the view of FIG. 5. The mainstem regions 26 and 30 have third and fourth widths $W_3$ and $W_4$ along such y-axis direction. In some embodiments, the widths $W_3$ and $W_4$ may be referred to as mainstem widths. The third and fourth widths $W_3$ and $W_4$ may be substantially the same as one another, and may be substantially the same as the first and second widths $W_1$ and $W_2$. For instance, in some embodiments third and fourth widths $W_3$ and $W_4$ may be less than or equal to about 100 micrometers (μm); and may, for example, be within a range of from about 3 μm to about 100 μm.

The projections 24 and 28 have lengths $L_1$ and $L_2$ along the y-axis direction. In some embodiments, the lengths $L_1$ and $L_2$ may be substantially the same as one another and may be at least about 1000 μm. For instance, in some embodiments the lengths $L_1$ and $L_2$ may be within a range of from about 1000 μm to about 10,000 μm.

The components 20 and 22 may each have any suitable number of fingers, and in some embodiments may have at least about 50 fingers, at least about 100 fingers, at least about 200 fingers, etc. The components 20 and 22 may have the same number of fingers as one another.

Figure 6:
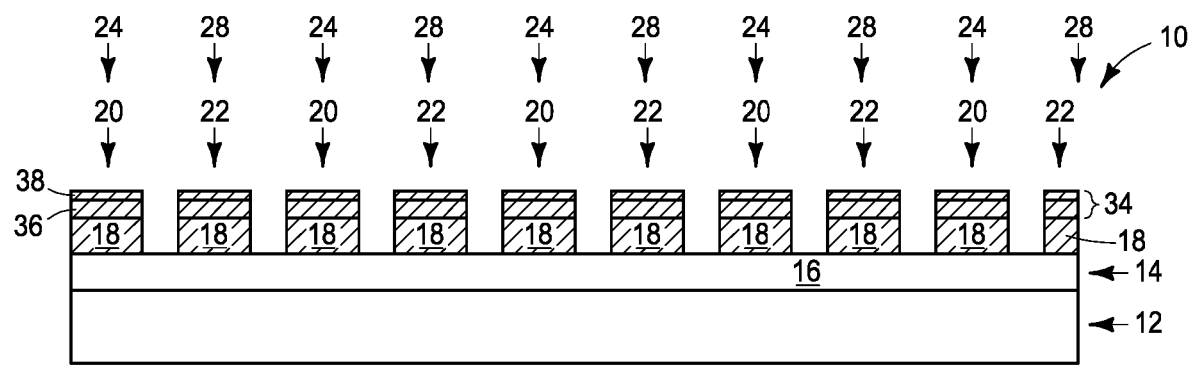
FIGS. 6 and 6A are a diagrammatic cross-sectional side views of the example region of the example assembly of FIG. 3 at example process stages subsequent to that of FIG. 4.

Referring to FIG. 6, a thin metallic layer 34 is formed over the support material 18 and is patterned into the configuration of the electrode bases 20 and 22. The metallic layer 34 may be patterned utilizing any suitable methodology, including, example, one or both of electron beam lithography and a lift-off technique.

In some embodiments, the material 18 may be referred to as a first metal-containing material, and the metallic layer 34 may be considered to comprise additional metal-containing material. In the illustrated embodiment, the metallic layer 34 comprises two materials 36 and 38.

The first material 36 may be a buffer layer provided between the second material 38 and the support material 18, and in some embodiments may comprise, consist essentially of, or consist of aluminum (Al). The first material 36 may be formed to any suitable thickness, and in some embodiments is formed to a thickness of less than or equal to about 10 nm, less than or equal to about 7 nm, etc.

The second material 38 comprises a catalyst for promoting growth of carbon nanotubes (carbon-containing nanotubes). In some embodiments, the second material 38 may comprise, consist essentially of, or consist of iron (Fe). The second material may be formed to any suitable thickness, and in some embodiments may be formed to a thickness of less than or equal to about 5 nm, less than or equal to about 3 nm, less than or equal to about 1 nm, etc.

Figure 6A:
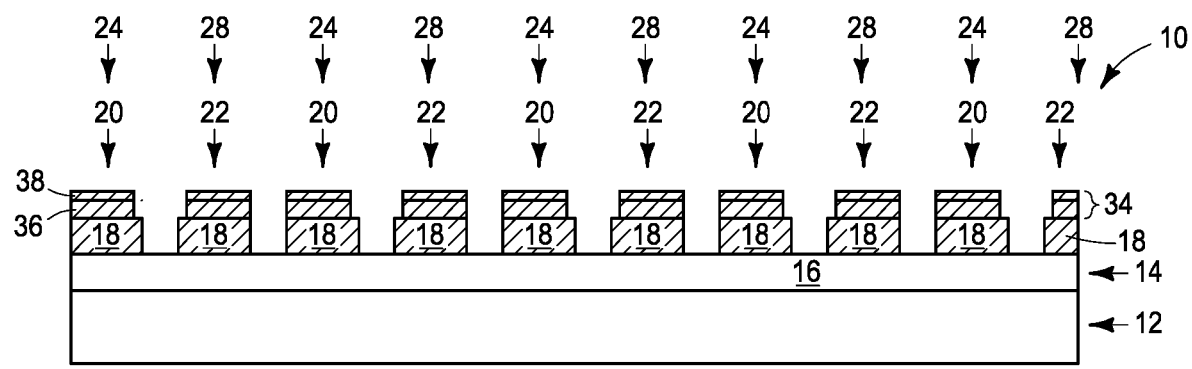

The embodiment of FIG. 6 shows the layer 34 extending across an entirety of an upper surface of the support material 18. In other embodiments, the layer 34 may only cover a portion of the support material 18. An example of such other embodiments is shown in FIG. 6A.

Figure 7:
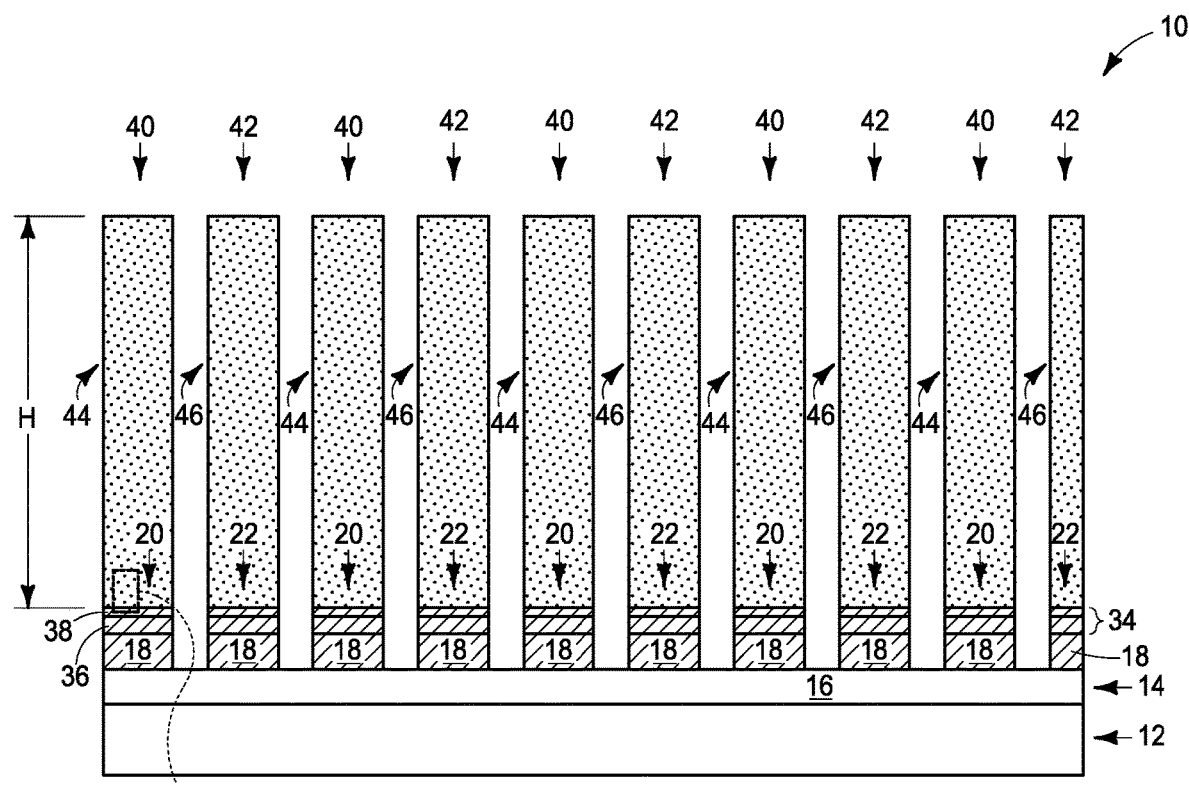
FIG. 7 is a diagrammatic cross-sectional side view of the example region of the example assembly of FIG. 3 at an example process stage subsequent to that of FIG. 6.

FIG. 7 shows the assembly 10 at a process stage subsequent to that of FIG. 6. Carbon nanotubes are formed to extend upwardly from the first and second electrode bases 20 and 22. The carbon nanotubes and electrode bases together form capacitor electrodes 40 and 42.

The carbon nanotubes may be considered to be configured as first and second membrane structures (or membranes) 44 and 46, with the first membrane structures 44 being associated with the first electrode bases 20, and with the second membrane structures 46 being associated the second electrode bases 22. Stippling is utilized to assist the reader in identifying the membrane structures 44 and 46. It is conventional to refer to packed arrangements of carbon nanotubes as membrane structures. Alternatively, a packed arrangement of carbon nanotubes may be referred to herein as a matrix, a mesh, etc.

It may be desirable to form the carbon nanotubes within the membranes 44 and 46 as vertically-aligned carbon nanotubes (VA-CNTs). Such may enable a high surface area to be achieved from the carbon nanotube surface, which may enable formation of a supercapacitor capable of achieving a high energy density. The term "vertically-aligned carbon nanotubes" will be understood by persons of ordinary skill. As utilized herein, such term means that the majority of the carbon nanotubes extend vertically relative to an upper surface of an underlying base structure. For instance, the majority of the carbon nanotubes may extend vertically relative to the upper surface of the catalyst material 38. The vertically-extending carbon nanotubes may or may not extend orthogonally relative to the upper surface of the catalyst material, provided that they extend generally vertically relative to such upper surface (with the term "generally vertically" meaning more upwardly than sidewardly). In some embodiments, the nanotubes may be curved, wavy, etc., rather than being straight, and may still be considered to extend vertically provided that the general overall direction of the majority of the nanotubes is vertical.

Figure 7A:
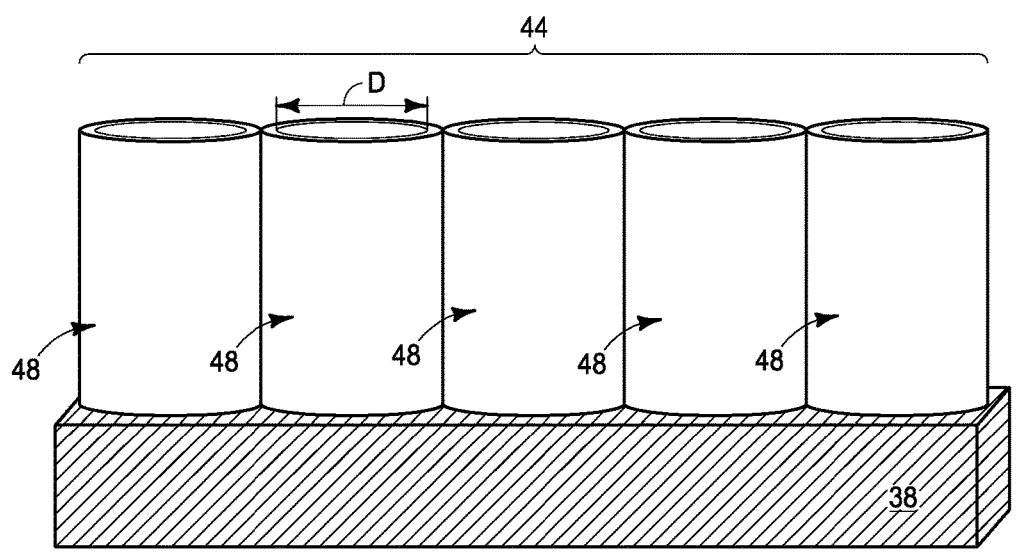
FIG. 7A is a diagrammatic three-dimensional view of a region of the example assembly of FIG. 7.

FIG. 7A diagrammatically illustrates an enlarged region of a portion of one of the membrane structures 44 of FIG. 7, and shows a plurality of vertically-extending (upwardly-extending) carbon nanotubes 48 within such region. The nanotubes 48 are shown to be tightly packed together.

The carbon nanotubes may be vertically-aligned, and may be formed with any suitable processing. In some embodiments, the nanotubes may be formed utilizing a vertical hot-wall Plassys reactor (reaction chamber) with a dedicated chemical vapor deposition (CVD) process. The carbon nanotubes may be grown utilizing $C_2H_2$ and $H_2$ in a helium carrier gas, with a temperature in the reaction chamber of at least about 590° C., and a pressure within the reaction chamber of less than or equal to about 0.4 millibar (mbar). The growth may be conducted for a duration of at least about 30 minutes, at least about 60 minutes, etc. The membranes 44 and 46 may be formed to vertical heights H (shown in FIG. 7) of at least about 50 μm, at least about 60 μm, etc. The carbon nanotubes 48 may have average tube diameters D (shown in FIG. 7A) within a range of from about 3 nm to about 7 nm. Although the tubes 48 are shown to be cylindrical, it is to be understood that the tubes may have any suitable closed shape when viewed top-down, including, for example, circular shapes, elliptical shapes, polygonal shapes, etc. If the tubes have a closed shape which is other than circular in top-down view, the distance D may correspond to a maximum distance across the interior of the tube rather than to a diameter. In some embodiments, the tubes may be polygonal in top-down view, and may have three or four sidewalls.

The carbon nanotubes 48 may be formed to any suitable density within the membrane structures 44 and 46, and in some embodiments may be formed to a density of at least about $5 \times 10^{11}/cm^2$. Such density may provide a surface area of at least about 2600 $m^2/g$ considering a mass density of about 0.3 g/cm$^3$. Such surface area may be considerably higher than that which may be achieved with conventional activated carbon electrodes.

The top ends of the carbon nanotubes 48 may or may not be pinched off. In some embodiments, it may be advantageous if the majority of the nanotubes 48 have top ends which are not pinched-off to enable materials (e.g., pseudocapacitive materials, electrolyte materials, etc.) to penetrate into the nanotubes.

Figure 8:
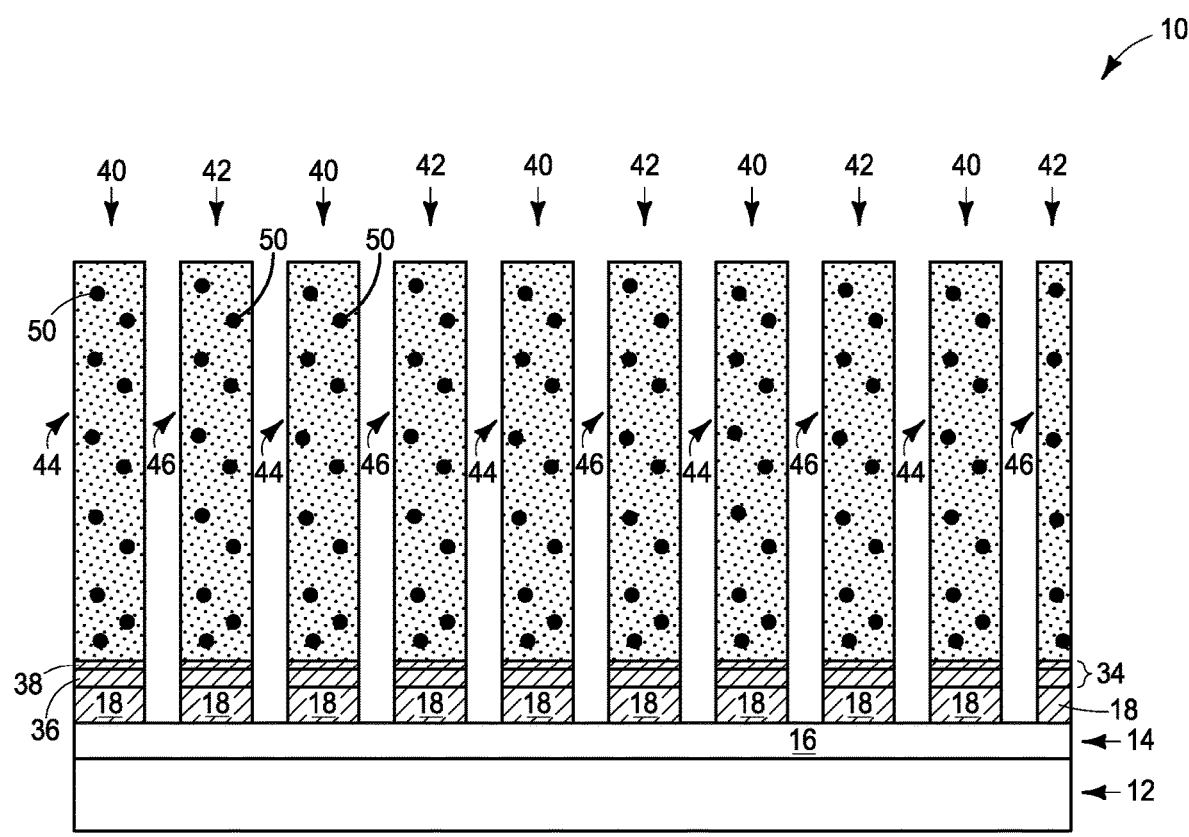
FIG. 8 is a diagrammatic cross-sectional side view of the example region of the example assembly of FIG. 3 at an example process stage subsequent to that of FIG. 7.

Referring to FIG. 8, pseudocapacitive material 50 (only some of which is labeled) is dispersed throughout the first and second membrane structures 44 and 46. The pseudocapacitive material may comprise any suitable composition(s); and in some embodiments may comprise electrically conductive polymer(s), transition metal oxide and/or transition metal sulfide. For instance, in some embodiments the pseudocapacitive material may comprise one or more of manganese (Mn), ruthenium (Ru) and iron (Fe), in combination with one or both of oxygen (O) and sulfur (S). For instance the pseudocapacitive material may comprise, consist essentially of, or consist of one or more of MnO, RuO and FeO, where the chemical formulas indicate primary constituents rather than specific stoichiometries. In some example embodiments, the MnO may be $MnO_2$, the RuO may be $RuO_2$, and the FeO may be $Fe_3O_4$.

In some embodiments, the pseudocapacitive material may be dispersed throughout the first and second membrane structures 44 and 46 utilizing a deposition process which includes one or more of atomic layer deposition (ALD), chemical vapor deposition (CVD), physical vapor deposition (PVD), etc.

The pseudocapacitive material 50 may increase the capacitance within a supercapacitor via redox reactions, and may thereby increase the overall energy density of the supercapacitor.

FIG. 9 diagrammatically illustrates a three-dimensional view of the interdigital electrodes 40 and 42, with such electrodes comprising the membrane structures 44 and 46, respectively. In the illustrated embodiment, the terminal 122 is coupled with the electrode 40, and the terminal 124 is coupled with the electrode 42. The terminals 122 and 124 may correspond to the structures described above with reference to FIG. 1.

FIG. 10 shows the assembly 10 after electrolyte material (electrolyte) 60 is formed within and between the first and second membrane structures 44 and 46 of the electrodes 40 and 42. The electrolyte material 60 may comprise any suitable composition(s), and in some embodiments may comprise a combination of sulfuric acid and polyvinyl alcohol (i.e., may comprise $H_2SO_4$-PVA).

The configuration of FIG. 10 comprises a supercapacitor 120. A protective cover (not shown) may be provided over such supercapacitor, and the supercapacitor may be utilized in integrated assemblies, including, for example, the assemblies described above with reference to FIGS. 1, 2 and 2A. The cover may include low-k dielectric, polymer, etc.

The supercapacitor 120 may be utilized in monolithic (on-chip) applications (e.g., in an assembly of the type shown in FIG. 2), or in off-chip applications (e.g., in an assembly of the type shown in FIG. 2A).

The supercapacitor configurations described herein may provide many advantages as compared to conventional designs. For instance, they may enable high capacitance to be achieved in a relatively small footprint, which may make them suitable for incorporation into highly-integrated assemblies. Also, they may be monolithically integrated into existing integrated assemblies due to the solid state nature of the carbon nanotubes. Additionally, the supercapacitors described herein may achieve high energy density, due to, at least in part, the high surface area associated with VA-CNTs. Also, cost efficiencies may be achieved due to, at least in part, the monolithic integrability of the supercapacitors described herein.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a supercapacitor supported by a semiconductor substrate. The supercapacitor includes first and second electrode bases. The first electrode base includes first laterally-projecting regions, and the second electrode base includes second laterally-projecting regions which are interdigitated with the first laterally-projecting regions. A distance between the first and second laterally-projecting regions is less than or equal to about 500 nm. Carbon nanotubes extend upwardly from the first and second electrode bases. The carbon nanotubes are configured as a first membrane structure associated with the first electrode base and as a second membrane structure associated with the second electrode base. Pseudocapacitive material is dispersed throughout the first and second membrane structures. Electrolyte material is within and between the first and second membrane structures.

Some embodiments include an integrated assembly comprising a supercapacitor associated with an NVRAM controller. The supercapacitor includes first and second electrode bases and carbon nanotubes extending upwardly from the first and second electrode bases. The carbon nanotubes are configured as a first membrane structure associated with the first electrode base and as a second membrane structure associated with the second electrode base. Pseudocapacitive material is dispersed throughout the first and second membrane structures. Electrolyte material is within and between the first and second membrane structures.

Some embodiments include a method of forming a supercapacitor. First and second electrode bases are formed over a semiconductor substrate. The first electrode base includes first laterally-projecting regions, and the second electrode base includes second laterally-projecting regions which are interdigitated with the first laterally-projecting regions. A distance between the first and second laterally-projecting regions is less than or equal to about 500 nm. Carbon nanotubes are formed to extend upwardly from the first and second electrode bases. The carbon nanotubes are configured as a first membrane structure associated with the first electrode base and as a second membrane structure associated with the second electrode base. Pseudocapacitive material is dispersed throughout the first and second membrane structures. Electrolyte material is formed within and between the first and second membrane structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly comprising a supercapacitor supported by a semiconductor substrate; the supercapacitor including:
    first and second electrode bases disposed over an insulative material, the first and second electrodes each comprising metal nitride directly against the insulative material, a buffer layer consisting of aluminum over the metal nitride and a catalyst layer consisting of iron over the buffer layer; the first electrode base including first laterally-projecting regions, and the second electrode base including second laterally-projecting regions which are interdigitated with the first laterally-projecting regions; a distance between the first and second laterally-projecting regions being less than or equal to about 500 nm;
    carbon nanotubes extending upwardly from the first and second electrode bases; the carbon nanotubes being configured as a first membrane structure associated with the first electrode base and as a second membrane structure associated with the second electrode base;
    pseudocapacitive material dispersed throughout the first and second membrane structures; and
    electrolyte material within and between the first and second membrane structures.

2. The integrated assembly of claim 1 wherein the integrated assembly includes a memory array directly under the supercapacitor.

3. The integrated assembly of claim 2 wherein the memory array is directly under only a portion of the supercapacitor.

4. The integrated assembly of claim 1 wherein the pseudocapacitive material comprises electrically conductive polymer, transition metal oxide and/or transition metal sulfide.

5. The integrated assembly of claim 1 wherein the pseudocapacitive material comprises one or more of MnO, RuO and FeO, where the chemical formulas indicate primary constituents rather than specific stoichiometries.

6. The integrated assembly of claim 1 wherein the electrolyte material comprises sulfuric acid and polyvinyl alcohol.

7. The integrated assembly of claim 1 wherein the carbon nanotubes have a vertical height of at least about 50 μm.

8. The integrated assembly of claim 1 wherein the carbon nanotubes have a vertical height of at least about 60 μm.

9. The integrated assembly of claim 1 wherein the carbon nanotubes have an average tube diameter of less than or equal to about 7 nm.

10. The integrated assembly of claim 1 wherein the carbon nanotubes have an average maximal distance across the individual nanotubes of less than or equal to about 7 nm.

11. The integrated assembly of claim 1 wherein the carbon nanotubes are at a density of at least about $5 \times 10^{11}/cm^2$ within the first and second membrane structures.

12. The integrated assembly of claim 1 wherein the carbon nanotubes have an average tube diameter within a range of from about 3 nm to about 7 nm.

13. The integrated assembly of claim 1 wherein the distance between the first and second laterally-projecting regions is within a range of from about 5 nm to about 500 nm.

14. The integrated assembly of claim 1 wherein the distance between the first and second laterally-projecting regions is within a range of from about 50 nm to about 500 nm.

15. The integrated assembly of claim 1 wherein the distance between the first and second laterally-projecting regions is less than or equal to about 250 nm.

16. The integrated assembly of claim 1 wherein the distance between the first and second laterally-projecting regions is less than or equal to about 150 nm.

17. The integrated assembly of claim 1 wherein:
    the first laterally-projecting regions project in a first direction and have first widths along a second direction orthogonal to said first direction;
    the second laterally-projecting regions project in a third direction opposite to the first direction, with the second direction being orthogonal to the third direction;

the second laterally-projecting regions have second widths along the second direction; and the first and second widths are less than or equal to about 100 μm.

18. The integrated assembly of claim 17 wherein the first and second widths are within a range of from about 3 μm to about 100 μm.

19. The integrated assembly of claim 17 wherein:

the first laterally-projecting regions have first lengths along the first direction;

the second laterally-projecting regions have second lengths along the third direction; and the first and second lengths are at least about 1000 μm.

20. The integrated assembly of claim 19 wherein the first and second lengths are within a range of from about 1000 μm to about 10,000 μm.

21. The integrated assembly of claim 17 wherein:

the first laterally-projecting regions project outwardly from a first mainstem region, with said first mainstem region having a first mainstem width along the first direction;

the second laterally-projecting regions project outwardly from a second mainstem region, with said second mainstem region having a second mainstem width along the third direction; and the first and second mainstem widths are less than or equal to about 100 μm.

22. The integrated assembly of claim 21 wherein the first and second mainstem widths are within a range of from about 3 μm to about 100 μm.

23. The integrated assembly of claim 1 wherein the first electrode base comprises at least 200 of the first laterally-projecting regions, and wherein the second electrode base comprises at least 200 of the second laterally-projecting regions.

* * * * *